United States Patent
Kapoor et al.

(10) Patent No.: US 10,043,690 B2
(45) Date of Patent: Aug. 7, 2018

(54) FAULT DETECTION USING SHOWERHEAD VOLTAGE VARIATION

(71) Applicant: Lam Research Corporation, Fremont, CA (US)

(72) Inventors: Sunil Kapoor, Vancouver, WA (US); Yaswanth Rangineni, Beaverton, OR (US); Aaron Bingham, Newberg, OR (US); Tuan Nguyen, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/077,850

(22) Filed: Mar. 22, 2016

(65) Prior Publication Data
US 2016/0293385 A1    Oct. 6, 2016

Related U.S. Application Data

(60) Provisional application No. 62/141,242, filed on Mar. 31, 2015.

(51) Int. Cl.
*H01L 21/67*    (2006.01)
*H01J 37/32*    (2006.01)
(Continued)

(52) U.S. Cl.
CPC .... *H01L 21/67253* (2013.01); *H01J 37/3244* (2013.01); *H01J 37/32082* (2013.01); *H01J 37/32091* (2013.01); *H01J 37/3299* (2013.01); *H01J 37/32174* (2013.01); *H01J 37/32568* (2013.01); *H01J 37/32926* (2013.01); *H01J 37/32935* (2013.01); *H01L 21/02274* (2013.01); *H01L 21/3065* (2013.01)

(58) Field of Classification Search
None
See application file for complete search history.

(56) References Cited

U.S. PATENT DOCUMENTS

| 8,282,983 B1 * | 10/2012 | Kapoor | H01J 37/32899 118/712 |
| 2006/0063284 A1 * | 3/2006 | Shuto | G01R 19/0061 438/15 |

(Continued)

*Primary Examiner* — Jiong-Ping Lu
(74) *Attorney, Agent, or Firm* — Martine Penilla Group, LLP

(57) ABSTRACT

A method includes providing radio frequency (RF) power from an RF power supply to a showerhead of a plasma processing system running a process operation on a substrate disposed in the plasma processing system. The method senses a voltage the showerhead using a voltage probe that is connected in-line between the RF power supply and the showerhead. The sensing of the voltage produces voltage values during the running of the process operation. The method includes comparing the voltage values against a voltage check band that is predefined for the process operation being run. The comparing is configured to detect when the voltage values are outside of the voltage check band. The method generates an alert when the comparing detects that the voltage values are outside of the voltage check band. The alert identifies a type of fault based on the voltage check band that was predefined for the process operation.

14 Claims, 10 Drawing Sheets

(51) Int. Cl.
*H01L 21/02* (2006.01)
*H01L 21/3065* (2006.01)

(56) References Cited

U.S. PATENT DOCUMENTS

2006/0137610 A1* 6/2006 Yoshizaki ............. C23C 16/325
                                                            118/723 E
2006/0275931 A1* 12/2006 Takizawa .......... H01J 37/32935
                                                            438/5

* cited by examiner

FAULT DETECTION USING SHOWERHEAD VOLTAGE VARIATION

CLAIM OF PRIORITY

The present patent application claims the benefit of and priority, under 35 U.S.C. § 119(e), to U.S. Provisional Patent Application No. 62/141,242, filed on Mar. 31, 2015, and titled "Fault Detection Using Showerhead Voltage Variation", which is incorporated by reference herein in its entirety for all purposes.

BACKGROUND

1. Field of the Invention

The present embodiments relate to semiconductor wafer processing equipment tools, and more particularly, systems and methods for detecting faults using showerhead voltage variations.

2. Description of the Related Art

Some semiconductor processing systems may employ plasma when depositing thin films on a substrate in a processing chamber. Generally, the substrate is arranged on a pedestal in the processing chamber. To create the thin film using chemical vapor deposition, one or more precursors are supplied by a showerhead to the processing chamber.

During processing, radio frequency (RF) power may be supplied to the showerhead or to an electrode to create plasma. For example, RF power may be supplied to the electrode embedded in a pedestal platen, which may be made of a non-conducting material such as ceramic. Another conducting portion of the pedestal may be connected to RF ground or another substantially different electrical potential.

When the electrode is excited by the RF power, RF fields are generated between the substrate and the showerhead to create plasma between the wafer and the showerhead. Plasma-enhanced chemical vapor deposition (PECVD) is a type of plasma deposition that is used to deposit thin films from a gas state (i.e., vapor) to a solid state on a substrate such as a wafer. PECVD systems convert a liquid precursor into a vapor precursor, which is delivered to a chamber.

During processing, however, it is often difficult to determine causes for process variations or faults without undue troubleshooting and/or system downtime.

It is in this context that inventions arise.

SUMMARY

Embodiments of the disclosure provide embodiments that utilize voltage sensing of a showerhead implemented in semiconductor processing tools, to identify and detect conditions that may affect the processing operations. In one embodiment, the describe systems include utilizing a voltage probe in line with the delivery of power to a processing system, so as to sense changes in voltages during operations that will signal and identify specific conditions that need attention or need correction.

The voltage data collected from the voltage probe is mapped to in-band and out-of band calibration data, which is configured to identify one or more specific faults. For example, using data obtained from the showerhead voltage variations it is possible to detect various components and/or system failures. Example detection can identify wafer misplacements, precursor failures, valve failures, RF Open or Short conditions, and others. In one embodiment, systems can be calibrated with known good components and systems. Using the voltage probe, baseline station voltages and natural variations are saved to a database or file. The variations may define a band, in which the voltage is expected for a station during specific process operations. During operation, a voltage probe can measure voltage variations, and based on deviations from the baseline station voltages, the system will identify or allow for identification of components/system failures. In one embodiment, an alarm is set when voltage varies beyond the natural variation. In another embodiment, a report is generated when a failure condition is detected. In another embodiment, a graphical user interface may identify the condition and suggest/recommend corrections. In still another embodiment, failures that occur over time can be saved to a database for historical review and/or analytic analysis.

In one embodiment, a method for detecting processing conditions of a plasma processing system is provided. The method includes providing radio frequency (RF) power from an RF power supply to a showerhead of the plasma processing system and running a process operation on a substrate disposed in the plasma processing system. The method further includes sensing a voltage the showerhead using a voltage probe that is connected in-line between the RF power supply and the showerhead. The sensing of the voltage produces voltage values during the running of the process operation. The method includes comparing the voltage values against a voltage check band that is predefined for the process operation being run. The comparing is configured to detect when the voltage values are outside of the voltage check band. The method also includes generating an alert when the comparing detects that the voltage values are outside of the voltage check band. The alert further configured to identify a type of fault based on the voltage check band that was predefined for the process operation.

In still another embodiment, a plasma processing system is provided. The system includes a pedestal for supporting a substrate, a showerhead for supplying process gases into the plasma processing system and over the substrate, and a radio frequency (RF) power supply for providing RF power to the showerhead of the plasma processing system. The system also includes a voltage probe connected in-line between the RF power supply and the showerhead. The voltage probe is configured to sense voltage values during running of a process operation to deposit a material over the substrate in the plasma processing chamber. The system further includes a controller configured to receive the sensed voltage values and compare the sensed voltage values against a voltage check band that is predefined for the process operation being run. The comparing is configured to detect when the voltage values are outside of the voltage check band and further configured to generate an alert when the comparing detects that the sensed voltage values are outside of the voltage check band. The alert is configured to identify a type of fault based on the voltage check band that was predefined for the process operation.

As used herein, an alert should be broadly considered to be data that is indicative of a condition. The data can be represented in graphical form, in text form, in audible form, in report form, in notification form, in historical data form, in fault signal form, in information form, or combinations of two or more thereof.

In various examples, without limitation to other types of faults and/or conditions, some system conditions include wafer misplacement, or precursor delivery failure, or valve operation failure, or an electrical short condition, or an electrical open condition.

DESCRIPTION

Embodiments of the disclosure provide embodiments of a process chamber, used for processing semiconductor wafers. In one implementation, method and systems are provided that enable detection of system conditions or faults by sensing voltage variations. In various examples defined herein, the voltage variations are sensed at the showerhead of the plasma processing chamber. Based on the sensed voltage or deviation from expected voltages or ranges in voltages, specific conditions can be identified or determined.

It should be appreciated that the present embodiments can be implemented in numerous ways, such as a process, an apparatus, a system, a device, or a method. Several embodiments are described below.

Deposition of films is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations. While in process, each wafer is held in place by a pedestal, wafer chuck and/or other wafer holding apparatus. For certain operations, the apparatus may include a heater such as a heating plate to heat the wafer.

Figure 1:
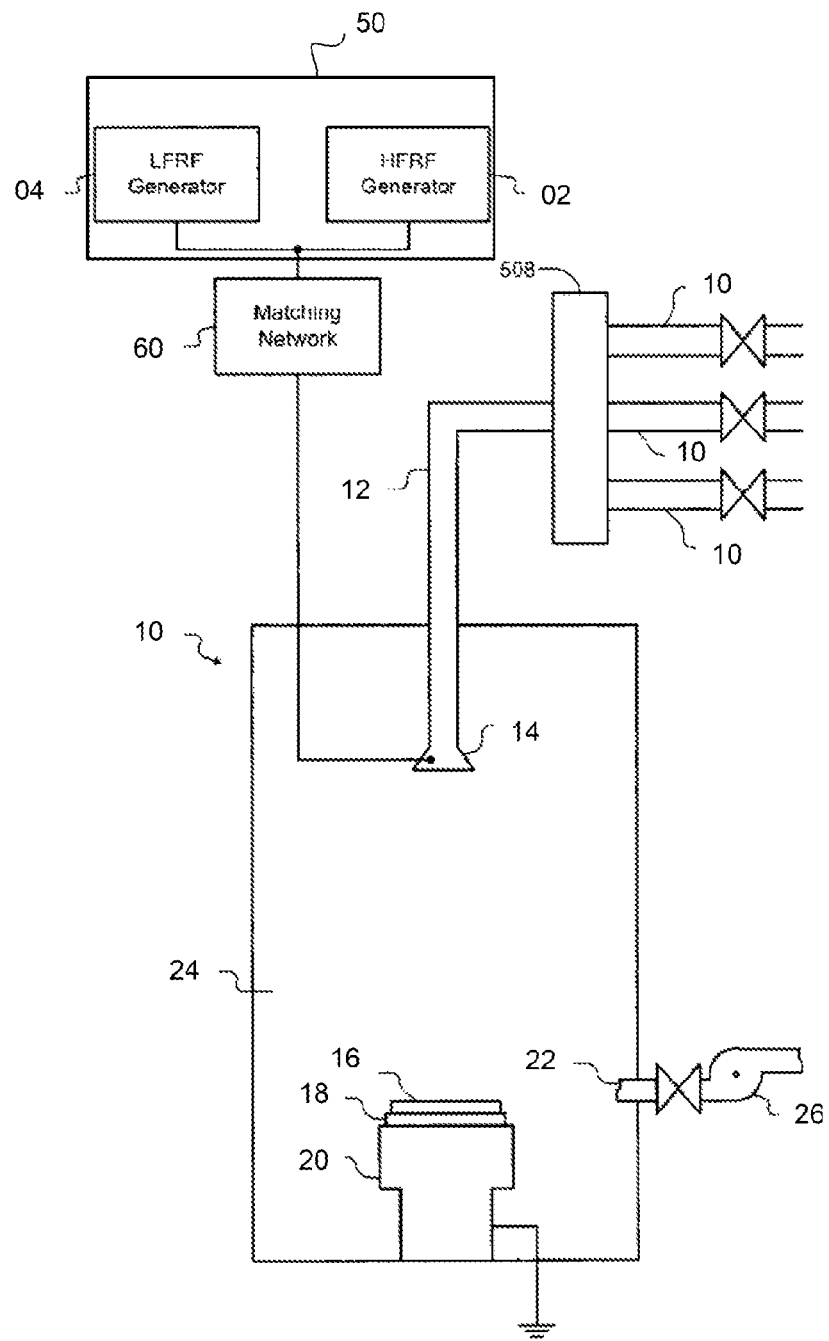
FIG. 1 illustrates a substrate processing system, which is used to process a wafer, e.g., to form films thereon.

FIG. 1 shows an exemplary CVD system. The deposition of film is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer. For example, a reactor 10 in FIG. 1 includes a process chamber 24, which encloses other components of the reactor and contains the plasma. The plasma may be generated by a capacitor type system including a showerhead 14 working in conjunction with a grounded heater block 20. A high-frequency RF generator 02, connected to a matching network 06, and a low-frequency RF generator 04 are connected to the showerhead 14. The power and frequency supplied by matching network 06 is sufficient to generate plasma from the process gas.

Within the reactor, a wafer pedestal 18 supports a substrate 16. The pedestal 18 typically includes a chuck, a fork, or lift pins to hold and transfer the substrate during and between the deposition and/or plasma treatment reactions. The chuck may be an electrostatic chuck, a mechanical chuck or various other types of chuck. The process gases are introduced via inlet 12. Multiple source gas lines 10 are connected to manifold 08. The gases may be premixed or not. Appropriate valving and mass flow control mechanisms are employed to ensure that the correct gases are delivered during the deposition and plasma treatment phases of the process.

Process gases exit chamber 24 via an outlet 22. A vacuum pump 26 (e.g., a one or two stage mechanical dry pump and/or a turbomolecular pump) draws process gases out and maintains a suitably low pressure within the reactor by a close loop controlled flow restriction device, such as a throttle valve or a pendulum valve. It is possible to index the wafers after every deposition and/or post-deposition plasma anneal treatment until all the required depositions and treatments are completed, or multiple depositions and treatments can be conducted at a single station before indexing the wafer.

Figure 2:
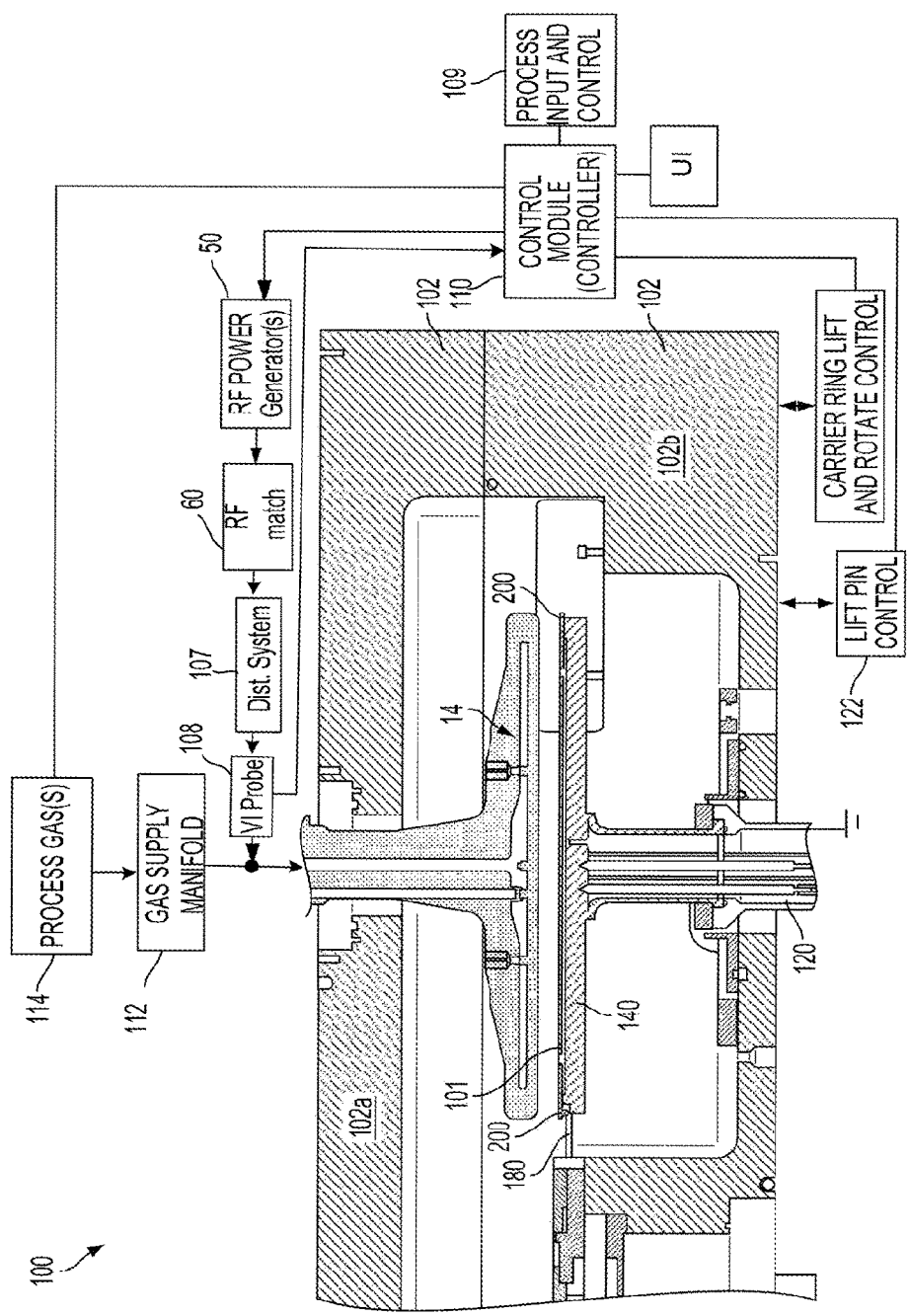
FIG. 2 illustrates an example chamber that utilizes a voltage probe to monitor the voltage of the showerhead during operation and provides sensed data back to a controller module for processing and identifying faults or conditions, in accordance with one embodiment of the present invention.

Although such systems work well, metrology systems are needed to monitor processing to detect failures or incorrect processing conditions. In the example of FIG. 2, the chamber may be a tool used for PECVD or ALD. By implementing metrology functionality, e.g., via one or more voltage probes, it is possible to detect any component failure on each station. In some examples, methods are implemented to detect various components and wafer placement failures using VI sensors, e.g., voltage probe 108.

FIG. 2 illustrates a substrate processing system 100, which is used to process a wafer 101. The system includes a chamber 102 having a lower chamber portion 102b and an upper chamber portion 102a. A center column is configured to support a pedestal 140, which in one embodiment is a grounded electrode. A showerhead 14 is electrically coupled to power supply (e.g., one or more RF power generators 50) via an RF match 60. The power supply 50 is controlled by a control module 110, e.g., a controller. The control module 110 is configured to operate the substrate processing system 100 by executing process input and control 109. The process input and control 109 may include process recipes, such as power levels, timing parameters, process gasses, mechanical movement of the wafer 101, etc., such as to deposit or form films over the wafer 101.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 14 and distributed in a space volume defined between the showerhead 14 face that faces the wafer 101, and the wafer 101 rests over the pedestal 140.

Figure 3:
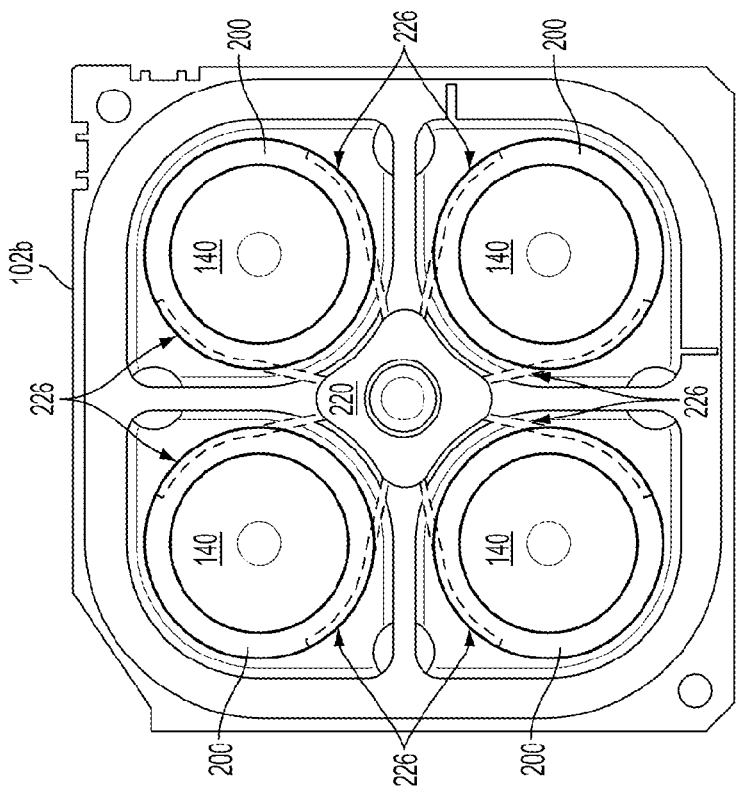

The RF match 60 may be coupled to an RF distribution system 107 that provides the RF power to the system 100. For example, if system 100 is one station of a set of stations as shown in FIG. 3 below, then the RF distribution system 107 is used to provide the RF power to the system 100. The RF power being delivered is then passed through a voltage probe 108 for sensing a voltage of the showerhead 14, during operation. The voltage data collected from the voltage probe 108 is mapped to in-band and out-of band calibration data, which is configured to identify one or more specific faults.

For example, use of showerhead voltage variation, by way of data read by the voltage probe 108, it is possible to detect various components and/or system failures. Example detection can identify wafer misplacement, precursor failures, clean dry air (CDA) valve failures, RF Open/Short failures, and others.

One method includes calibrating a system with known good components and systems. Using the voltage probe, the baseline station voltages and natural variations are saved to a database or file. During operation, the voltage probe 108 can measure voltage variations, and based on deviations from the baseline station voltages, the system will identify or allow for identification of components/system failures. In one embodiment, an alarm is set when voltage varies beyond the natural variation.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system.

FIG. 3 illustrates a top view of a multi-station processing tool, wherein four processing stations are provided. This top view is of the lower chamber portion 102b (e.g., with the top chamber portion 102a removed for illustration), wherein four spider stations are accessed by spider forks 226. Each spider fork, or fork includes a first and second arm, each of which is positioned around a portion of each side of the pedestal 140. In this view, the spider forks 226 are drawn in dashlines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101. As noted above, sometimes a wafer may not be well placed on a pedestal after rotation, and the voltage sensing is configured to identify such conditions, e.g., and identify the station in which the misplaced wafer is located. In one embodiment, each station will include a voltage probe 108 for sensing the voltage. In some embodiments, each station may include more than one voltage probe, e.g., a different probe for each different RF frequency source.

Figure 4:
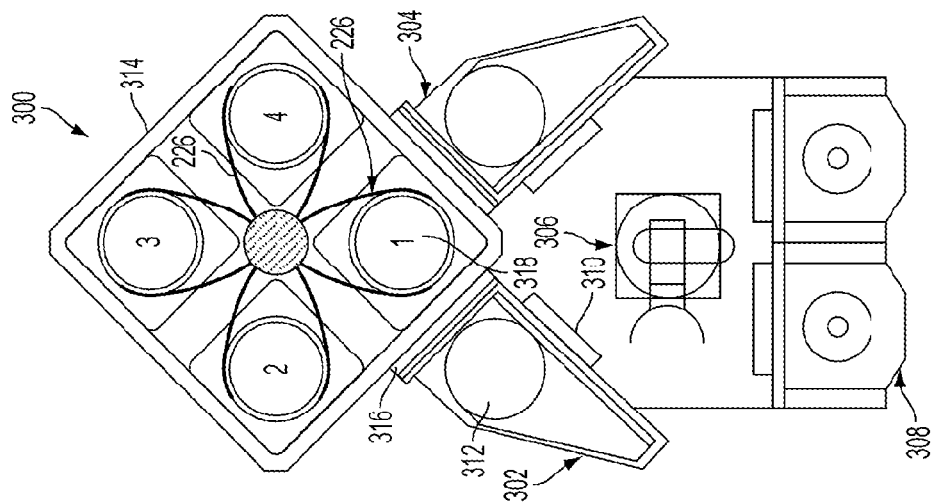
FIGS. 3 and 4 illustrate top views of a multi-station processing tool, wherein four processing stations are provided, in accordance with one embodiment.

FIG. 4 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown) may move the substrate from inbound load lock 302 to a pedestal 140 of a first process station for processing.

The depicted processing chamber 102b comprises four process stations, numbered from 1 to 4 (i.e., station S1, S2, S3 and S4) in the embodiment shown in FIG. 3. In some embodiments, processing chamber 102b may be configured to maintain a low pressure environment so that substrates may be transferred using a carrier ring 200 among the process stations without experiencing a vacuum break and/ or air exposure. Each process station depicted in FIG. 3 includes a process station substrate holder (shown at 318 for station 1) and process gas delivery line inlets.

Figure 5:
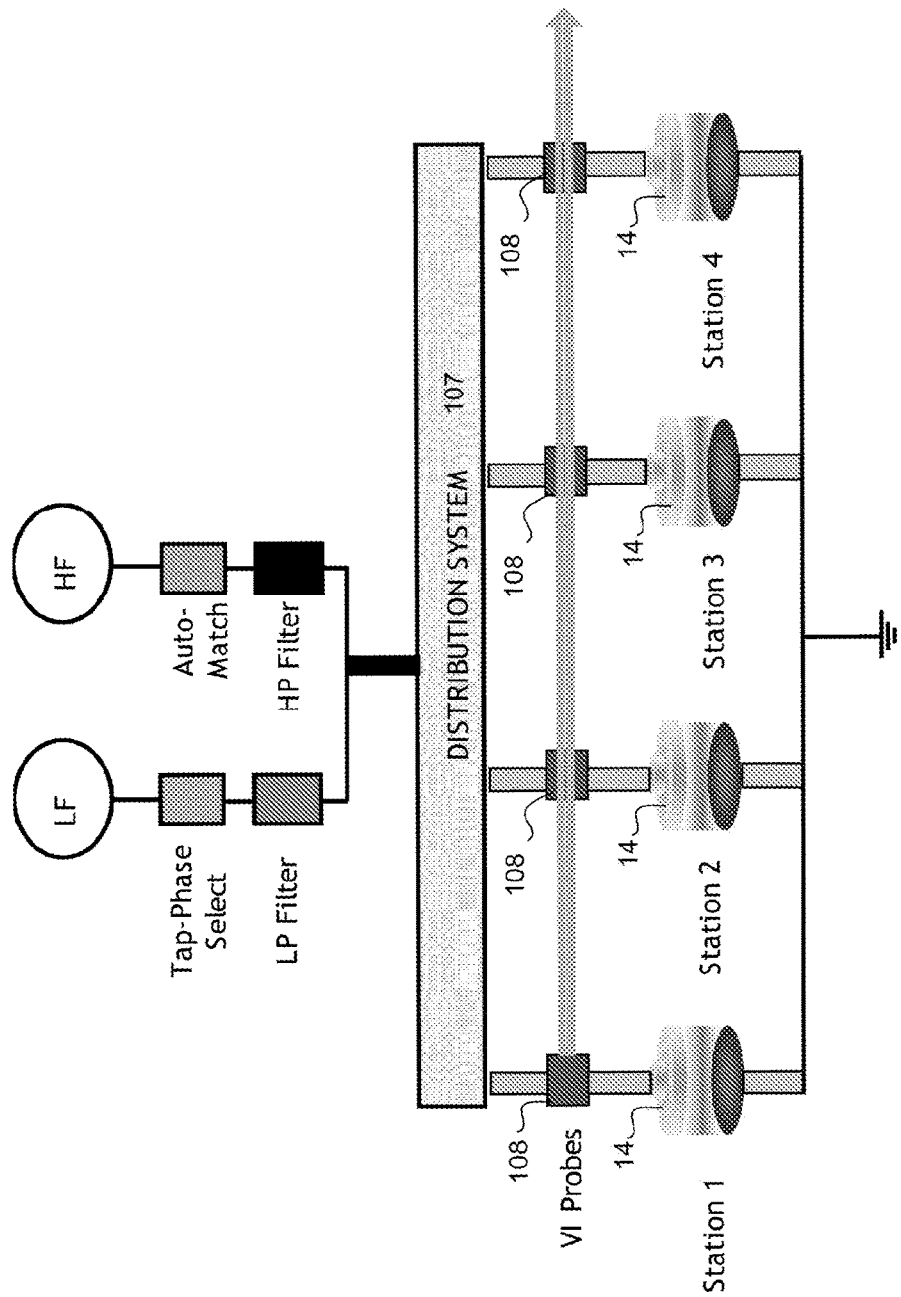
FIG. 5 illustrates one exemplary diagram of providing voltage probes at each one of process stations 1, 2, 3, and 4, in accordance with one embodiment.

FIG. 5 illustrates one exemplary diagram of providing voltage probes at each one of process stations 1, 2, 3, and 4. The process stations may be the process stations described in FIGS. 3 and 4 above. As shown, RF power is provided in this example by a low frequency generator (LF) and a high-frequency generator (HF). In one embodiment, the high-frequency generator provides power at a frequency of 13.56 MHz and the low frequency generator provides power at a frequency of 400 kHz. It should be understood that these frequencies are only exemplary. The low frequency generator and the high frequency generator are coupled through match circuitry and filters that connect the RF power to a distribution system, such as distribution system 107 of FIG. 2.

The voltage probes 108 are coupled in-line along the power feeds that connect the distribution system 107 and each of the showerheads 14 in the respective stations. In one embodiment, a single voltage probe 108 is connected in-line between each showerhead 14 and the distribution system 107, e.g., a 13.56 MHz voltage probe. In another embodiment, more than one voltage probes 108 can be connected serially between the showerhead 14 and the distribution system 107 at each station. In some embodiments, voltage probes 108 for use in probing voltages from power supplies providing wider frequency operation are possible. For example, although one voltage probe 108 may be designed for 13.56 MHz, the voltage probe may be capable of use along a wider frequency range around 13.56 MHz. In still other embodiments, voltage probes that can function in wide frequency ranges, such as 100 kHz to 100 MHz may be used.

In general, so long as a voltage probe is provided and coupled to the showerhead 14 in-line with delivered power to the showerhead 14, it is possible to sense the voltage experienced by the process station. Sensing the voltage at the showerhead 14, as mentioned above, will produce different voltage readings depending on the process conditions. In one embodiment, a database of process conditions are pre-calibrated and assigned to expected voltage readings. During operation, sensing the voltage variations at the showerhead 14 will enable generation of specific voltage readings. In the example shown, the output of the voltage sensors is communicated to the system controller 110. The system controller can the provide information via a graphical user interface or display screen or report.

These voltage readings can then be compared to expected voltage readings from the database, e.g. from previously calibrated voltages. In specific examples, programs instructions enable display or alerts identifying a fault or potential metrology problem. In one embodiment, depending on the process operation being performed, the specific voltage reading that is expected will identify the type of failure or system defect. Examples of these detected voltage variations are provided below, with reference to specific detected variations in process, which are correlated to the voltage readings.

Figure 6A:
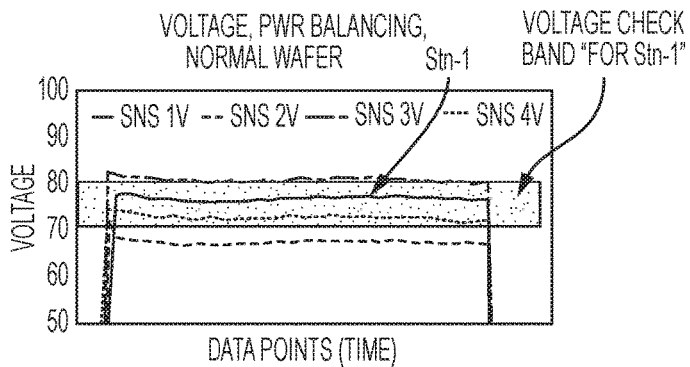
FIGS. 6A through 6C illustrate graphically the results of voltage sensing at the showerhead 14, which detects wafer misplacement at a specific station.
Figure 6B:
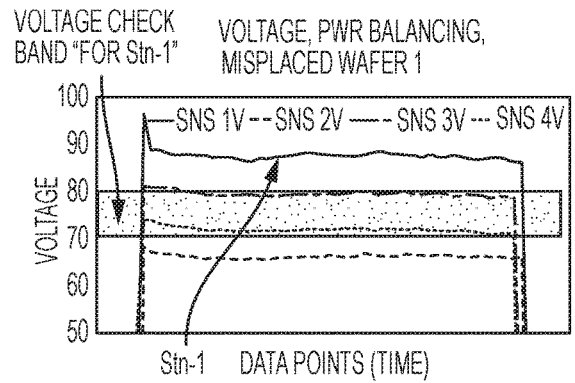
Figure 6C:
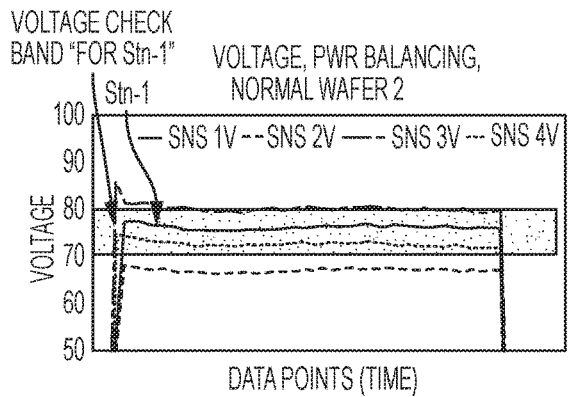

FIGS. 6A through 6C illustrate graphically the results of voltage sensing at the showerhead 14, which detects wafer misplacement at a specific station. FIG. 6A illustrates a voltage reading for each of the 4 stations. This example is provided to illustrate a voltage band associated with the voltage operation of the showerhead at station 1. Although the voltages of other stations are shown in FIGS. 6A-6C, this illustration that defines a voltage check band only relates to the sensed voltage at the showerhead of station 1 (stn-1). Furthermore, this illustration shows that when the wafer is misplaced by about 2 mm over the pedestal of station 1, a variation in voltage illustrated in FIG. 6B will occur. In this example, the voltage sensed by the voltage probe at station 1 will produce a voltage that is outside of the voltage check band. As a confirmation, the wafer is properly set in station 1 and the voltage is rechecked at the showerhead using the voltage probe discussed above.

FIG. 6C illustrates that the voltage sensed by the voltage probe at the showerhead 14 has now returned to about the center region of the voltage check band. Accordingly, the voltage check band for the other voltages sensed in each of the other stations will have their own voltage check bands, which are verified during operation to determine if wafer misplacement has been detected. In one embodiment, the wafer misplacement detection can be performed to determine if the voltage increases by 15 V on a station when 2 mm wafer misplacement is occurring. If the other stations do not have a wafer misplacement, the other stations will have voltages that will remain within their respective voltage check bands.

Figure 7:
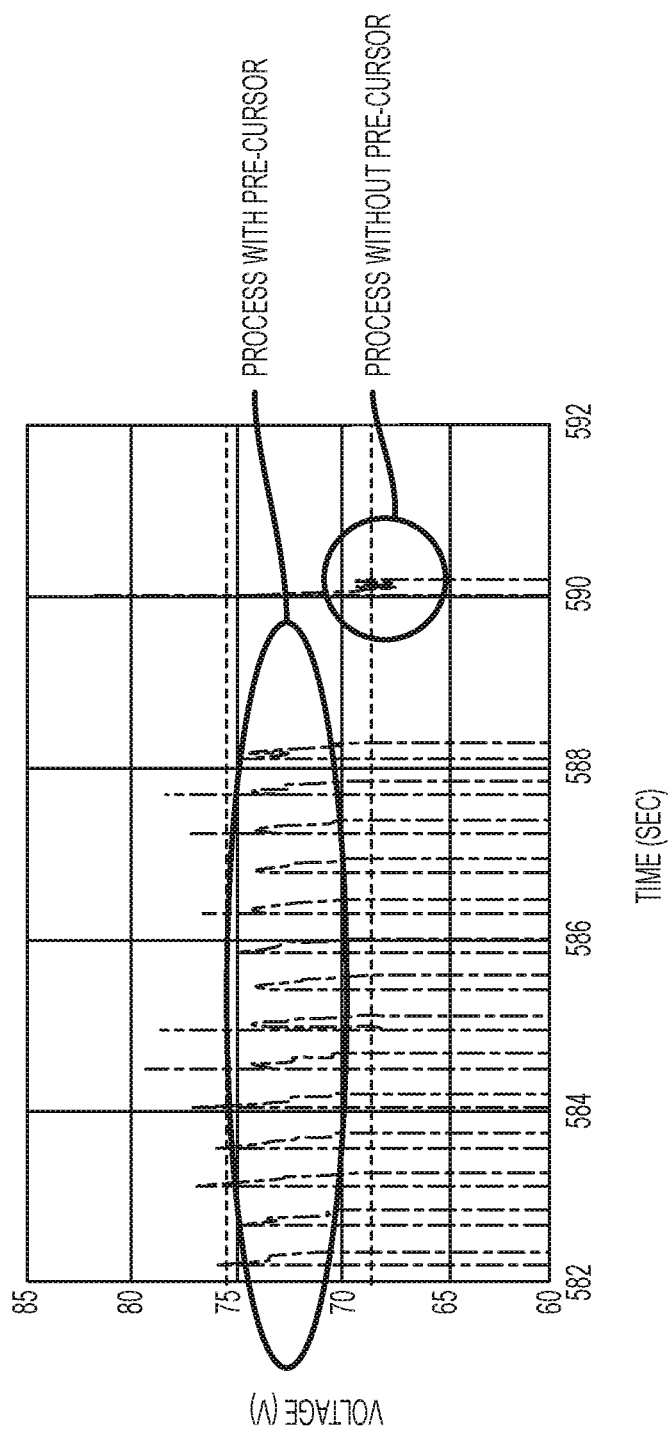
FIG. 7 illustrates an example where precursor failure detection is processed using the showerhead voltage detected using the voltage probe, in accordance with one embodiment.

FIG. 7 illustrates an example where precursor failure detection is processed using the showerhead voltage detected using the voltage probe 108, described above. In this example, during normal operation the showerhead voltage is shown to operate within a safe operating band, which ranges between approximately 68 V and 71 V. When the precursor is not present or there is a failure in the precursor delivery, a different voltage signal will be detected, which would be just below the safe operating band. Accordingly, the showerhead voltage sensing can be used for detecting precursor failures. It should be understood that the example provided and the voltage ranges provided are only exemplary, and each process operation will have its own normalized or expected safe operating band so as to enable detection of failures during operation, in response to sense the voltages from the showerhead.

Figure 8B:
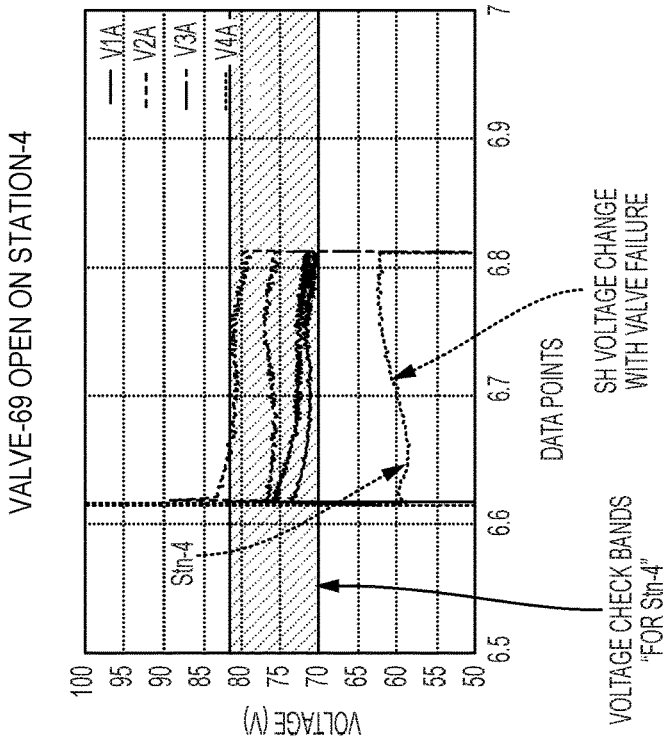
FIGS. 8A and 8B illustrates an example where valve failures that supply gases can also be monitored and detected for specific failures using the sensed voltage of the showerhead, during operation, in accordance with one embodiment.
Figure 8A:
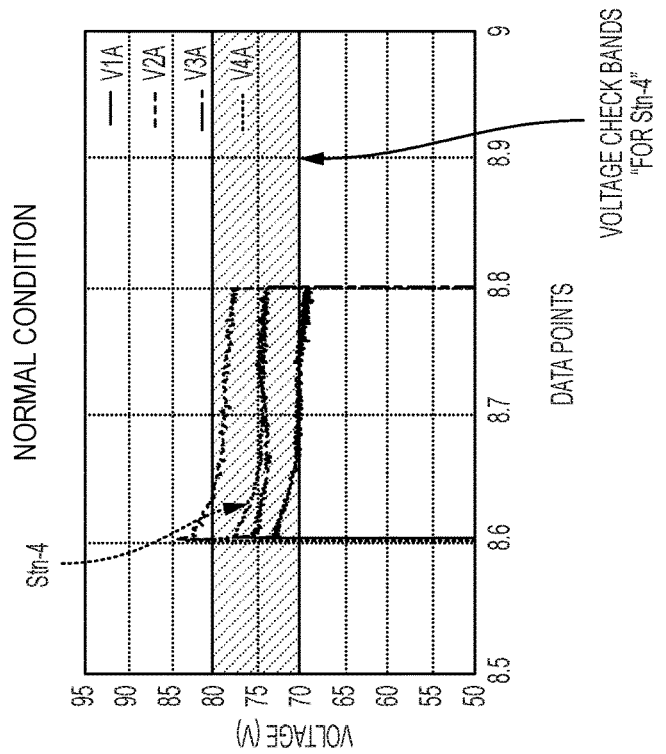

FIGS. 8A and 8B illustrates an example where valve failures that supply gases can also be monitored and detected for specific failures using the sensed voltage of the showerhead, during operation. FIG. 8A illustrates a normal condition during processing for each of the four processing stations. The voltage check band for station 4 is shown highlighted to illustrate the region in which the voltage is expected during normal operation. As mentioned above, each station may have its own voltage check band (e.g., range in which the voltages are considered acceptable). In other embodiments, each station may share the same voltage check band. The cases in which the voltage check bands are different or the same will depend on the process conditions and operations being performed in each of the process stations. Generally, a single process station will have its own voltage check band for the specific processing operation, which will signify whether a fault or failure has occurred in the processing or the system components for the wafer handling, or combinations thereof.

In the specific example of FIG. 8B, the voltage signal for station for is shown to have dropped outside of the voltage check band, which signals that the showerhead voltage change is associated with a valve failure. In one example, the valve may be providing a gas, such as clean dry air (CDA), or other gases utilized during processing of the semiconductor wafer. Further, this example illustrates that a voltage drop of approximately 15 V occurred if one of the valves is opened on a particular station, e.g. station 4.

Figure 9A:
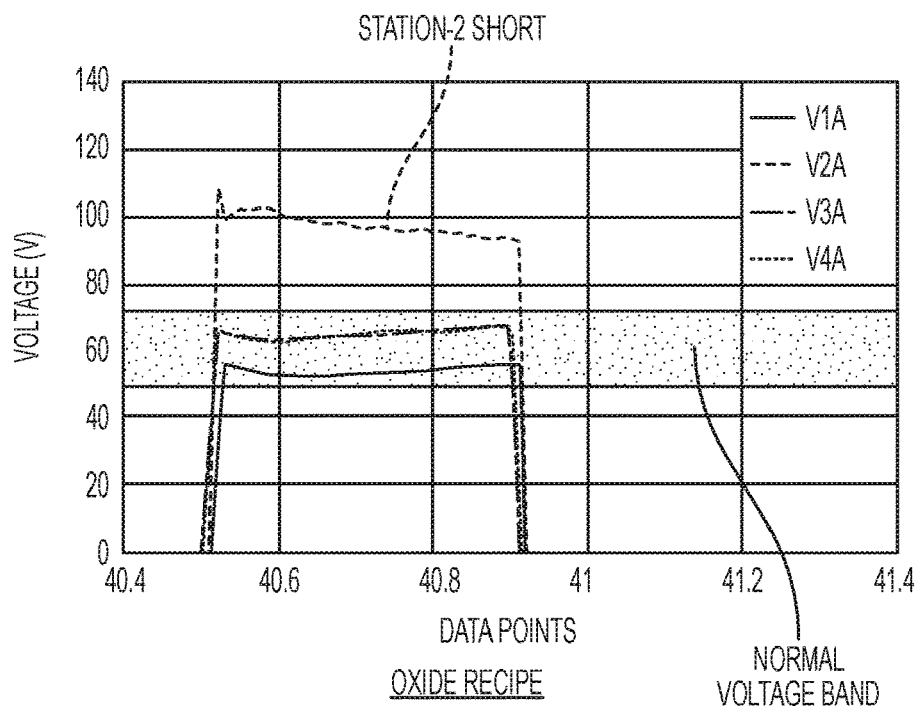
FIGS. 9A and 9B illustrate an example of utilizing the voltage probe to detect the voltage of the showerhead and changes in the voltage to detect shorts in the processing chamber, in accordance with one embodiment.
Figure 9B:
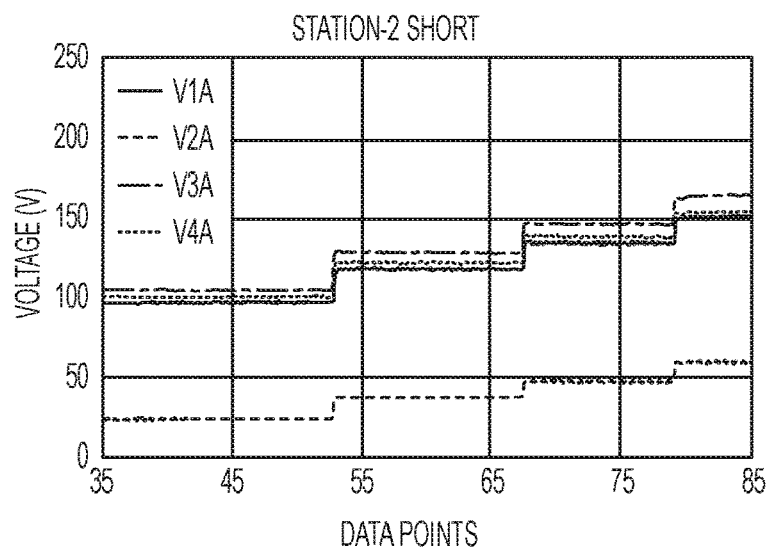

FIGS. 9A and 9B illustrate an example of utilizing the voltage probe to detect the voltage of the showerhead and changes in the voltage to detect shorts in the processing chamber. In the example shown in FIG. 9A, a normal voltage band is shown for processing and oxide recipe. During this processing, station to is shown to have a voltage that is outside of the normal voltage band, which signifies a short. Other process stations that are within the normal voltage band are considered to not have a short, based on this voltage reading. In this example, the voltage band considered normal is shared by the 4 process stations. As such, a shorted station can be detected with the showerhead voltage variation measurements, which are compared and analyzed based on calibration data, which may be stored in a database.

FIG. 9B illustrates an example of varying voltages utilized during a processing operation. That is, at different times, the voltage that is considered acceptable for each of the processing stations will be within a specific acceptable band. The acceptable band is not drawn in FIG. 9B, but it is understood to be clustered around the voltages read for each of the stations 1, 3, and 4. In this example, station 2 is not clustered with the other stations voltage readings, which indicates that station has experienced a short, since the voltage has dropped toward zero volts. In contrast, it can open conditions where the detected voltage reading will actually increase beyond the normal band.

Figure 10A:
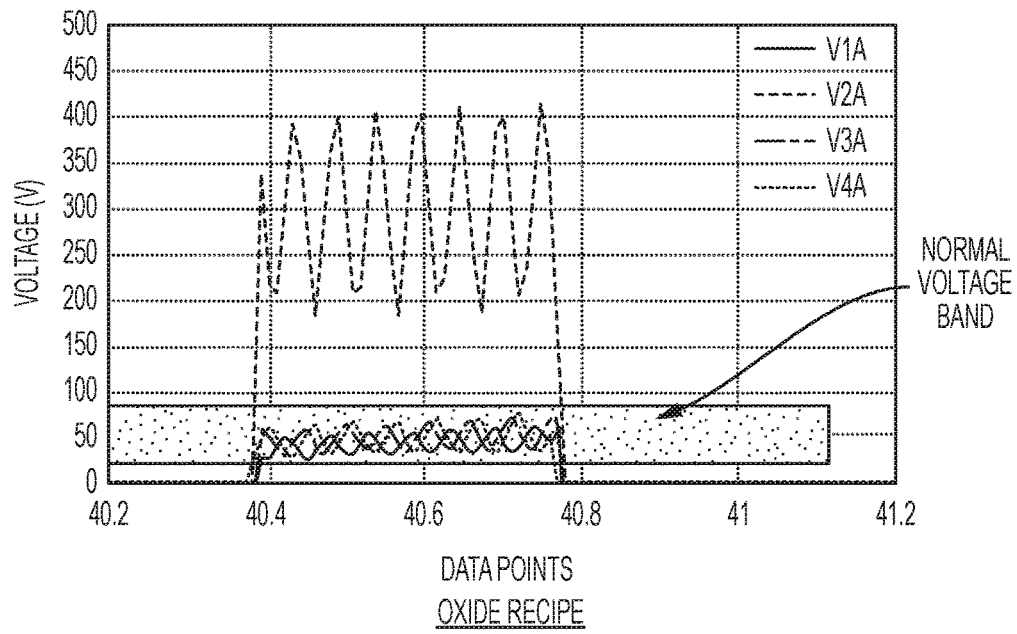
FIGS. 10A and 10B illustrate an example where showerhead voltage variations can be monitored to identify and detect conditions when the station is experiencing an electrical open condition.
Figure 10B:
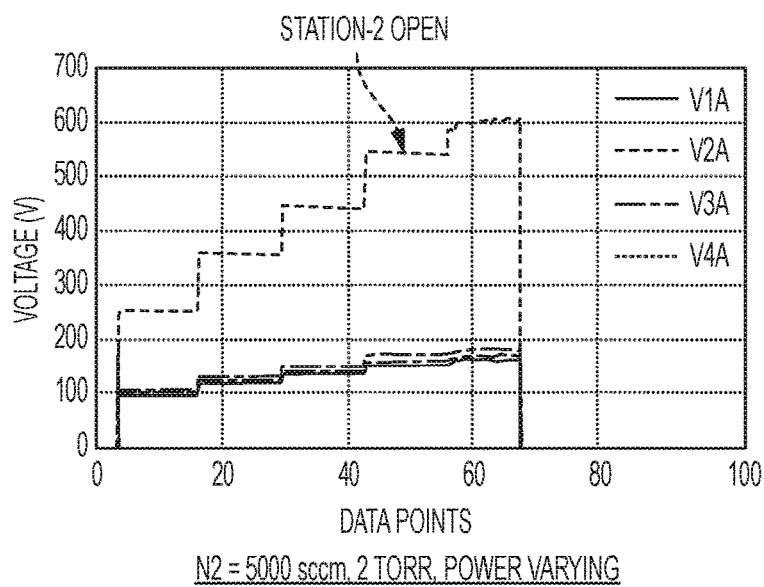

FIGS. 10A and 10B illustrate an example where showerhead voltage variations can be monitored to identify and detect conditions when the station is experiencing an electrical open condition. The electrical open condition is in contrast to the electrical short described above. When an electrical open condition is experience, the voltage level of station 2 is shown to spike beyond the normal voltage band in FIG. 10 A. Further, the other voltages for the other stations remain within the voltage band which is shared for this example between the stations.

FIG. 10 B illustrates example where the varying power cycles will also detect open condition of station-2, when the voltage increases beyond the cluster of voltages experienced by the other stations that are not experiencing an electrical open condition. This illustration has been provided to show that using the voltage probe 108 coupled to the showerhead 14 enables for precise detection of faults and conditions of a processing system during operation.

In addition, detecting various voltages can also be correlated and mapped to calibrated data stored in a database, such that lookup operations can quickly identify what a specific voltage variation means and can provide the information as an alert, or as a report, or as a graphical user data to a user or operator of the system. By monitoring the voltage of the showerhead in this manner, it is possible to identify a multitude of system conditions that are or can be affecting the processing operations, which provides a type of in-line metrology that surfaces specific conditions that can be corrected or adjusted during operation.

Figure 11:
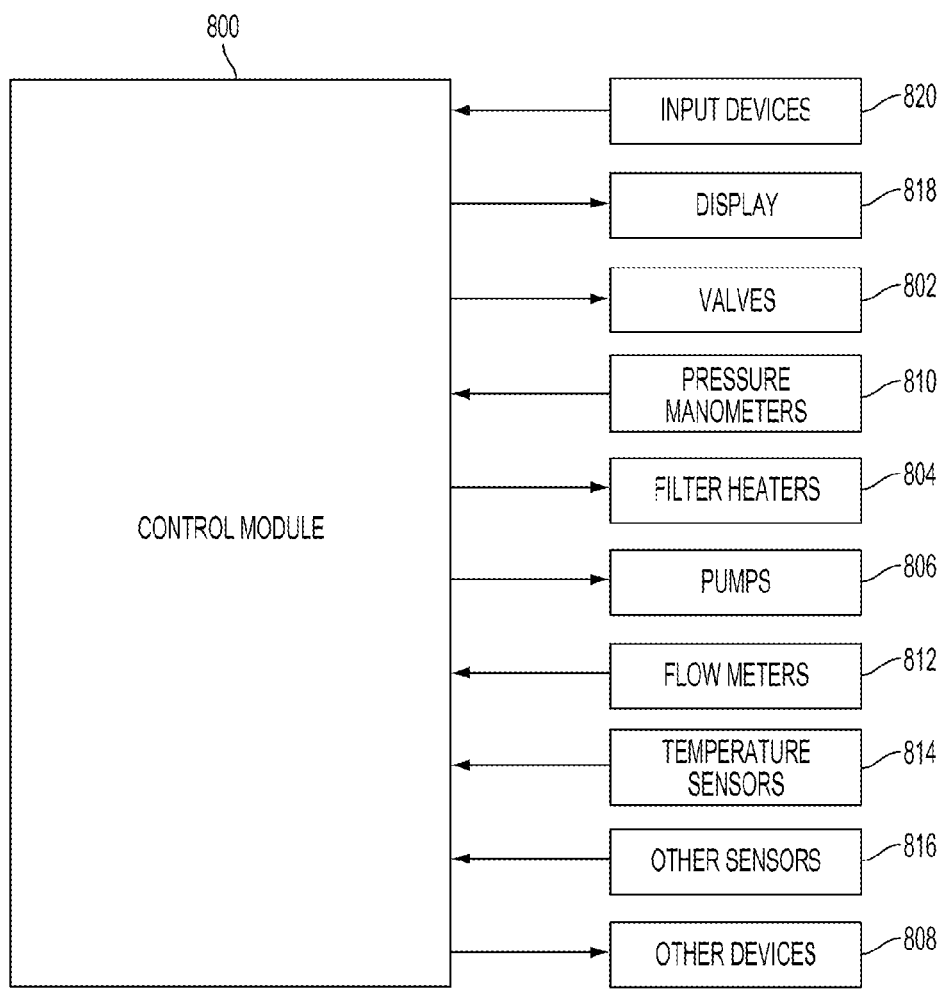
FIG. 11 shows a control module for controlling the systems, in accordance with one embodiment.

FIG. 11 shows a control module 800 for controlling the systems described above. In one embodiment, the control module 110 of FIG. 1 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multichamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method for detecting processing conditions of a plasma processing system that includes multiple stations, comprising, providing radio frequency (RF) power from an RF power supply to a showerhead of each station of the multiple stations of the plasma processing system;

running a process operation on substrates disposed in each station of the multiple stations of the plasma processing system;

at each station of the multiple stations, sensing a voltage of the showerhead using a voltage probe that is connected in-line between the RF power supply and the showerhead, the voltage sensed of the showerhead being sensed over a period of time, the sensing of the voltage producing voltage values during the running of the process operation at each station of the multiple stations;

comparing the voltage values for each station against a voltage check band that is predefined for the process operation being run, the comparing is configured to detect which station produced voltage values that are outside of the voltage check band; and generating an alert when the comparing detects that voltage values associated with at least one of the multiple stations are outside of the voltage check band, the alert further configured to identify a type of fault based on an amount of variation positive or negative of sensed voltages in relation to the voltage check band that was predefined for the process operation, and identify a specific one or more of the multiple stations associated with the fault.

2. The method of claim 1, further comprising,
running a second process operation on the substrates or other substrates in the multiple stations of the system, the second process operation being associated with a respective voltage check band that is predefined for the second process operation.

3. The method of claim 1, further comprising,
performing a calibration operation for the plasma processing system, the calibration operation producing information for defining the voltage check band for the process condition, the information being saved to a database and accessed during the comparing operation.

4. The method of claim 3, wherein the calibration operation produces information for a plurality of voltage check bands associated with a plurality of process operations, wherein each one of the plurality of voltage check bands corresponds to specific system conditions.

5. The method of claim 4, wherein ones of the specific system conditions include wafer misplacement, or precursor delivery failure, or valve operation failure, or an electrical short condition, or an electrical open condition.

6. The method of claim 1, wherein the process operation is a deposition process configured to deposit a layer of material over the substrates.

7. The method of claim 1, wherein the type of fault is one of a wafer misplacement, or a precursor delivery failure, or valve operation failure, or an electrical short condition, or an electrical open condition.

8. The method of claim 1, further comprising:
generating a graphical representation of the voltage check band that illustrates the voltage values over the period of time for each station of the multiple stations, the graphical representation of the voltage check band is configured to graphically display which of the multiple stations is associated with the fault.

9. A method for detecting faults associated with processing conditions of a plasma processing system that includes multiple stations, comprising,
providing radio frequency (RF) power from an RF power supply;
distributing the RF power to supply power to showerheads of each station of the multiple stations;
running a process operation on substrates disposed in each station of the multiple stations;
at each station of the multiple stations, sensing a voltage of the showerhead using a voltage probe that is connected in-line between the RF power supply and the showerhead, the voltage sensed of the showerhead being sensed over a period of time, the sensing of the voltage producing voltage values during the running of the process operation at each station of the multiple stations;
comparing the voltage values for each station against a voltage check band that is predefined for the process operation being run, the comparing is configured to detect which station produced voltage values that are outside of the voltage check band by illustrating the voltage values over the period of time for each station of the multiple stations on a graph of a display interfaced with the plasma processing system; and
generating an alert when the comparing detects that voltage values associated with at least one of the multiple stations are outside of the voltage check band, the alert further configured to identify a type of fault based on an amount of variation positive or negative of sensed voltages in relation to the voltage check band that was predefined for the process operation, and the graph is configured to identify a specific one or more of the multiple stations associated with the fault.

10. The method of claim 9, further comprising,
running a second process operation on the substrates or other substrates in the multiple stations, the second process operation being associated with a respective voltage check band that is predefined for the second process operation.

11. The method of claim 9, further comprising,
performing a calibration operation for the plasma processing system, the calibration operation producing information for defining the voltage check band for specific process conditions, the information being saved to a database and accessed during the comparing operation.

12. The method of claim 9, further comprising,
processing a calibration operation that produces information for a plurality of voltage check bands associated with a plurality of process operations, wherein each one of the plurality of voltage check bands corresponds to specific system conditions.

13. The method of claim 12, wherein ones of the specific system conditions include wafer misplacement, or precursor delivery failure, or valve operation failure, or an electrical short condition, or an electrical open condition.

14. The method of claim 9, wherein the process operation is a deposition process configured to deposit a layer of material over the substrates.

* * * * *